United States Patent [19]

Shirai

[11] Patent Number: 5,477,491

[45] Date of Patent: Dec. 19, 1995

[54] SEMICONDUCTOR MEMORY DEVICE WITH A SELF-INITIALIZING CIRCUIT OPERABLE AFTER SUPPLY OF POWER

[75] Inventor: Akihiro Shirai, Hyogo, Japan

[73] Assignee: Mitsubishi Denki Kabushiki Kaisha, Tokyo, Japan

[21] Appl. No.: 431,383

[22] Filed: Apr. 28, 1995

Related U.S. Application Data

[63] Continuation of Ser. No. 15,008, Feb. 9, 1993, abandoned.

[30] Foreign Application Priority Data

Mar. 25, 1992 [JP] Japan .................................. 4-066959

[51] Int. Cl.$^6$ .................................................. G11C 11/34
[52] U.S. Cl. .................... 365/194; 365/193; 365/233; 365/222
[58] Field of Search ............................ 365/193, 189.01, 365/194, 222, 233, 236, 189.09, 189.08, 226, 229, 228, 201; 307/269, 271, 272.3, 296.3, 296.1

[56] References Cited

U.S. PATENT DOCUMENTS

| | | | |
|---|---|---|---|
| 4,716,551 | 12/1987 | Inagaki | 365/222 |
| 4,933,902 | 6/1990 | Yamada et al. | 307/272.3 |
| 5,278,792 | 1/1994 | Inoue et al. | 365/193 |

FOREIGN PATENT DOCUMENTS

| | | | |
|---|---|---|---|
| 60-242587 | 12/1985 | Japan . | |
| 1220516 | 9/1989 | Japan | 307/272.3 |

OTHER PUBLICATIONS

"80386 Hardward Reference Manual", Intel Literature Sales, Santa Clara, Calif., 1987, pp. 6–15–6–28.

Primary Examiner—David C. Nelms
Assistant Examiner—F. Niranjan
Attorney, Agent, or Firm—Lowe, Price, LeBlanc & Becker

[57] ABSTRACT

An improved DRAM includes an internal circuit to be initialized upon start of supply of a supply voltage. The DRAM includes a dummy clock signal generator, and applies a dummy clock signal to a clock signal generator through a switching circuit until a predetermined time period elapses after the start of supply of the supply voltage by a timer circuit. A signal /RAS is controlled in a special manner, is not required for initializing an internal circuit such as a refresh counter. Therefore, a load required in the external circuit for initialing the DRAM is reduced.

12 Claims, 4 Drawing Sheets

SEMICONDUCTOR MEMORY DEVICE WITH A SELF-INITIALIZING CIRCUIT OPERABLE AFTER SUPPLY OF POWER

This application is a continuation of application Ser. No. 08/015,008, filed Feb. 9, 1993, now abandoned.

BACKGROUND OF THE INVENTION

1. Field of the Invention

The present invention relates, in general, to a semiconductor memory device, and, in particular, to a semiconductor memory device provided with an internal circuit to be initialized upon start of supply of a supply voltage. The invention has a particular applicability to a dynamic random access memory device.

2. Description of the Background Art

In recent years, semiconductor memories such as dynamic random access memories (which will be called as "DRAMs"), static random access memories (which will be called as "SRAMs") and serial access memories have been integrated more highly, and various function circuits have been added thereto. Generally, the semiconductor memories have been used in various electronic equipments such as a computer.

Generally, a supply voltage starts to be supplied to a semiconductor memory when the supply voltage starts to be supplied to an electronic equipment. The semiconductor memory is internally provided with various function circuits, as described above. These function circuits must be initialized or reset before the start of normal operation of the semiconductor memory.

An internal circuit using a counter circuit can be exemplified as the function circuit to be initialized or reset upon start of the supply of supply voltage. For example, the DRAM has a self-refresh function for automatically or periodically refreshing a data signal stored in a memory cell array, as is well known. For carrying out the self-refresh operation, the DRAM includes a counter for generating a refresh address, i.e., refresh counter. Since output data of the refresh counter can be arbitrary immediately after the supply of supply voltage, the state of the refresh counter must be initialized or reset before the start of the normal refresh operation.

Similarly, a serial access memory such as a video RAM having a serial access function includes a serial counter for sequentially selecting serial data to be sent therefrom. Also the serial counter must be initialized or reset before the start of the normal serial access operation.

In the conventional semiconductor memory, the function circuit or internal circuit described above is initialized or reset by carrying out an initializing mode or reset mode called a "dummy cycle" immediately after the supply of supply voltage. For this purpose, conventionally, a state control signal such as a row address strobe signal /RAS is externally applied, and the dummy cycle is carried out under this external state control signal.

When the dummy cycle is carried out, a clock signal generator disposed in the DRAM initializes various internal function circuits (e.g., refresh counter) in response to toggle of the signal /RAS. Since the normal operation cannot start without initializing the internal function circuit, as described above, it is essential to apply the toggle of the signal /RAS to the DRAM from an externally disposed circuit immediately after the supply of the supply voltage.

The invention can be applied to various semiconductor memories such as DRAM, SRAM and serial access memory, but description will be made on an example in which the invention is applied to the DRAM.

FIG. 4 is a block diagram of a conventional DRAM. Referring to FIG. 4, a DRAM 200 includes a memory cell array 58 including a large number of memory cells disposed in rows and columns, a row decoder 55 for selecting a row in the memory cell array 58 to be accessed, a column decoder 56 for selecting a column to be accessed, a sense amplifier 63 for amplifying data signals read from selected cells, and an I/O gate circuit 57 for selecting a bit line pair in response to an output signal supplied from the column decoder 56. An address buffer 54 receives externally applied address signals A0–A9. The address signals A0–A9 include row address signals RA0–RA8 and column address signals CA0–CA8 in a time sharing manner. The row address signals RA0–RA8 are applied to the row decoder 55. The column address signals CA0–CA8 are applied to the column decoder 56. The address signal A9 is applied to an I/O controller 65.

A clock signal generator 51 receives an external state control signal for controlling the operation state of the DRAM 200, and specifically it receives a row address strobe signal /RAS, a column address strobe signal /CAS, a write enable signal /WE, an output enable signal /OE and the like. The clock signal generator 51 applies clock signals for controlling the timing to various circuits disposed in the DRAM 200 in response to these state control signals.

The DRAM 200 has the self-refresh function described before. For carrying out the self-refresh, the DRAM 200 further includes a refresh counter 53 for generating a refresh address, and a refresh controller 52 for controlling the refresh counter 53. The refresh controller 52 is responsive to a refresh control signal Srf applied from the clock signal generator 51 to apply a counter control signal Scc for controlling the refresh counter 53 to the refresh counter 53. The refresh counter 53 is responsive to the counter control signal Scc to apply refresh addresses Q0–Q8 to the address buffer 54. The address buffer 54 is responsive to the refresh addresses Q0–Q8 applied thereto to apply the row address signals RA0–RA8 for therefresh to the row decoder 55. The row decoder 55 sequentially selects the memory cell rows in the memory cell array 58, whereby the data signals stored in the memory cell array 58 are refreshed.

In the write operation, input data Di to be stored in the memory cell array 58 is applied to an input buffer 59, and then is applied through an I/O line 66 and the I/O gate circuit 57 to the bit line pair (not shown) selected by the column decoder 56. The data signal applied to the bit line pair is stored in the memory cells (not shown) selected by the row decoder 55.

In the read operation, the data signals stored in the memory cells selected by the row decoder 55 are amplified by a sense amplifier 63. The signal selected from the amplified data signals by the column decoder 56 is applied through the I/O gate circuit 57 and the I/O line 66 to an output buffer 60. The output buffer 60 amplifies the data signal applied thereto, and then externally supplies the amplified signal as output data Do.

Also in the DRAM 200 shown in FIG. 4, it is necessary to carry out the foregoing dummy cycle immediately after the start of supply of a supply voltage Vcc. Specifically, after the start of supply of the supply voltage Vcc, an externally disposed circuit (not shown) applies signals /RAS, which are repeated for several cycles, e.g., eight cycles, to the clock signal generator 51. In other words, it is necessary for carrying out the dummy cycle to apply signals /RAS, which are repeated, e.g., for eight cycles, from the externally disposed circuit. The clock signal generator 51 is responsive to the toggle of signal /RAS to apply a refresh control signal Srf for initializing or resetting the refresh counter 53 to the refresh controller 52. The refresh controller 52 is responsive to the signal Srf to apply a counter control signal Scc for initializing or resetting the refresh counter to the refresh counter 53. Therefore, the refresh counter 53 is reset prior to the normal self-refresh operation.

The clock signal generator 51 initializes or resets not only the refresh counter 53 but also various internal function circuits (not shown) disposed in the DRAM 200 immediately after the start of supply of the supply voltage Vcc. In order to carry out the initializing or resetting operation by the clock signal generator 51, the toggle of signal /RAS must be applied from the externally disposed circuit. This means that the external circuit is required to generate the toggle of a special signal /RAS for the initialization, resulting in an increase of a load on the external circuit, e.g., system side in a computer system.

SUMMARY OF THE INVENTION

An object of the invention is to reduce a load required in an external circuit for controlling a semiconductor memory device.

Another object of the invention is to reduce a load required in an external circuit for initializing a semiconductor memory device after the start of supply of a supply voltage.

Still another object of the invention is to reduce a load required in an external circuit for controlling a dynamic random access memory device.

Yet another object of the invention is to reduce a load required in an external circuit for initializing a dynamic random access memory device after the start of supply of a supply voltage.

Briefly stated, a semiconductor memory device according to the invention includes an internal circuit to be initialized upon start of supply of a supply voltage, an initialization control circuit for initializing and controlling the internal circuit in response to a clock pulse applied thereto, a time elapse detecting circuit for detecting elapse of a predetermined time length after the start of supply of the supply voltage, an internal clock pulse generating circuit for receiving the supply voltage and generating an internal clock pulse, and a selective supply circuit responsive to the time elapse detecting circuit for selectively applying one of an externally applied state control clock pulse and the internal clock pulse to the initialization control circuit.

In operation, the selective supply circuit applies the internal clock pulses generated from the internal clock pulse generating circuit to the initialization control circuit until elapse of the predetermined time period after the start of supply of the supply voltage. After the time elapse detecting circuit detects the elapse of the predetermined time period, the selective supply circuit applies the externally applied state control clock pulse to the initialization control circuit. The initialization control circuit is responsive to the externally applied state control clock pulse to control the internal circuit. Until the elapse of the predetermined time period after the start of supply of the supply voltage, the internally generated internal clock pulses are used for initializing the internal circuit, so that it is not necessary to apply an external clock pulse for initialization. Therefore, a load required in an external circuit for initializing the internal circuit is reduced.

According to another aspect of the invention, a dynamic random access memory includes a memory cell array provided with a plurality of memory cells disposed in rows and columns, a refresh counter for generating a refresh count signal for refreshing a data signal stored in the memory cell array, a reset circuit for resetting the refresh counter in response to a clock pulse applied thereto, a timer circuit for detecting elapse of a predetermined time length after supply of a supply voltage, a ring oscillator which receives the supply voltage and generates a dummy clock pulse for operating the dynamic random access memory under a dummy cycle, and a switching circuit which is responsive to an output signal supplied from the timer circuit to selectively apply one of the dummy clock pulse and an externally applied row address strobe signal to the reset circuit.

The foregoing and other objects, features, aspects and advantages of the present invention will become more apparent from the following detailed description of the present invention when taken in conjunction with the accompanying drawings.

DESCRIPTION OF THE PREFERRED EMBODIMENT

Figure 1:
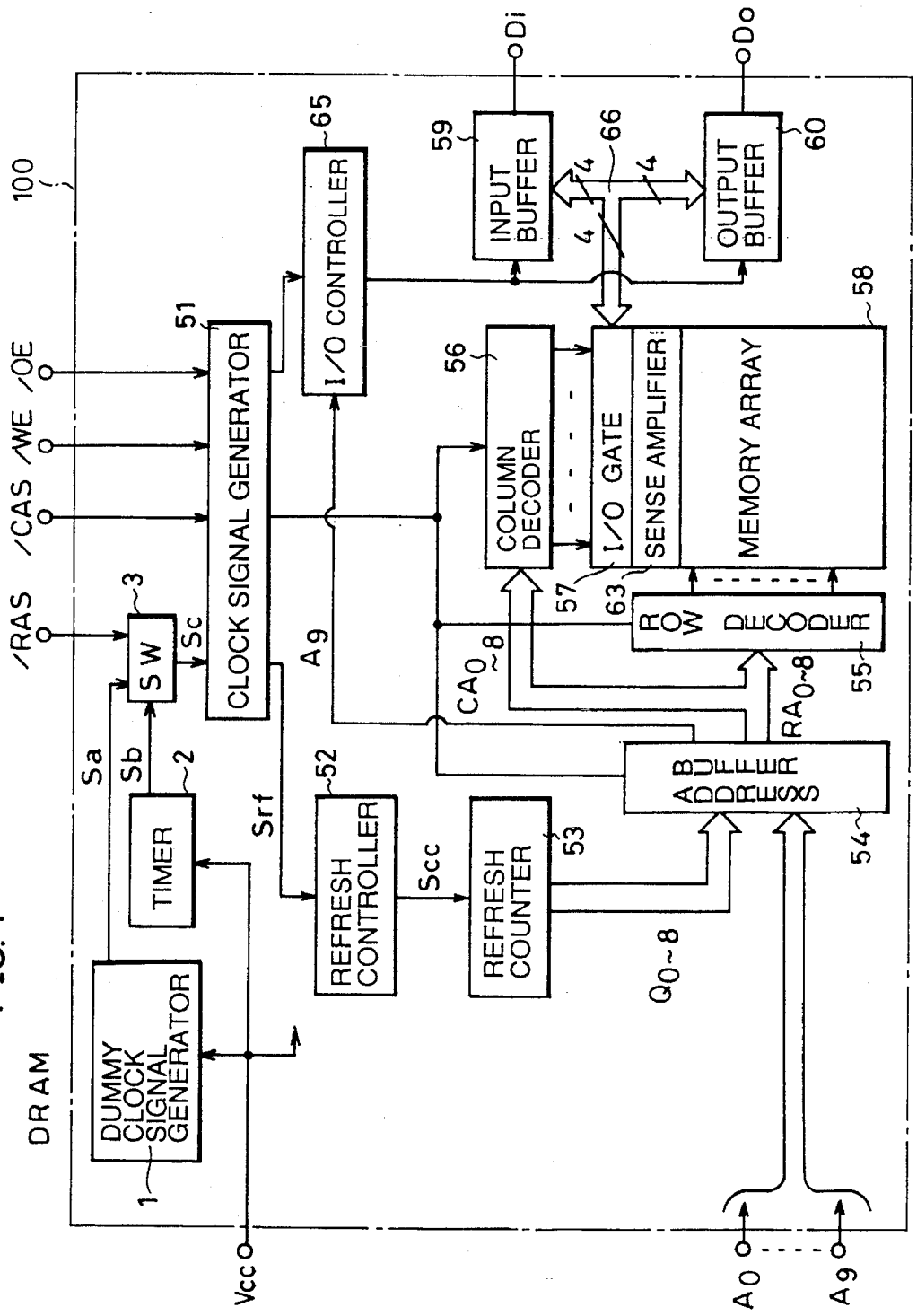
FIG. 1 is a block diagram of a DRAM of an embodiment of the invention.
Figure 4:
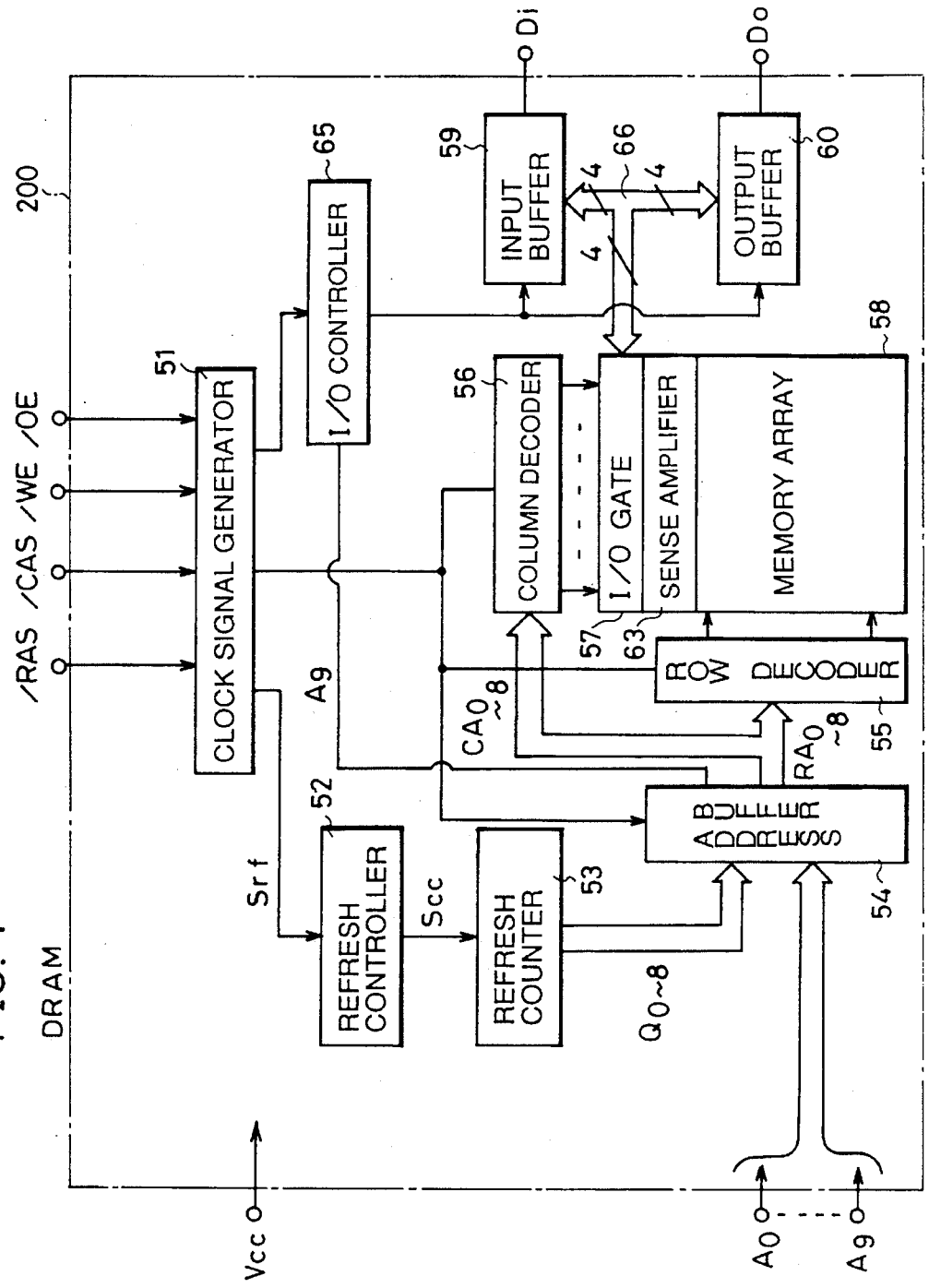
FIG. 4 is a block diagram of a conventional DRAM.

Referring to FIG. 1, a DRAM 100 includes, in addition to components in the conventional DRAM 200 shown in FIG. 4, a dummy clock signal generator 1, a timer circuit 2 and a switching circuit 3. The dummy clock signal generator 1 receives a supply voltage Vcc and generates a dummy clock signal Sa having a predetermined frequency. The timer circuit 2 receives the supply voltage Vcc and detects elapse of a predetermined time length after the start of supply of the supply voltage. The timer circuit 2 supplies a switching control signal Sb for controlling the switching circuit 3.

The switching circuit 3 receives an externally applied signal /RAS and the dummy clock signal Sa supplied from the dummy clock signal generator 1. The switching circuit 3 is responsive to a switching control signal Sb sent from the timer circuit 2 to apply one of the signals /RAS and Sa to the clock signal generator 51 as an output signal Sc. Constructions and operations of the other circuits in the DRAM 100 are similar to those in the conventional DRAM 200 shown in FIG. 4, and will not be described hereinafter.

Figure 2:
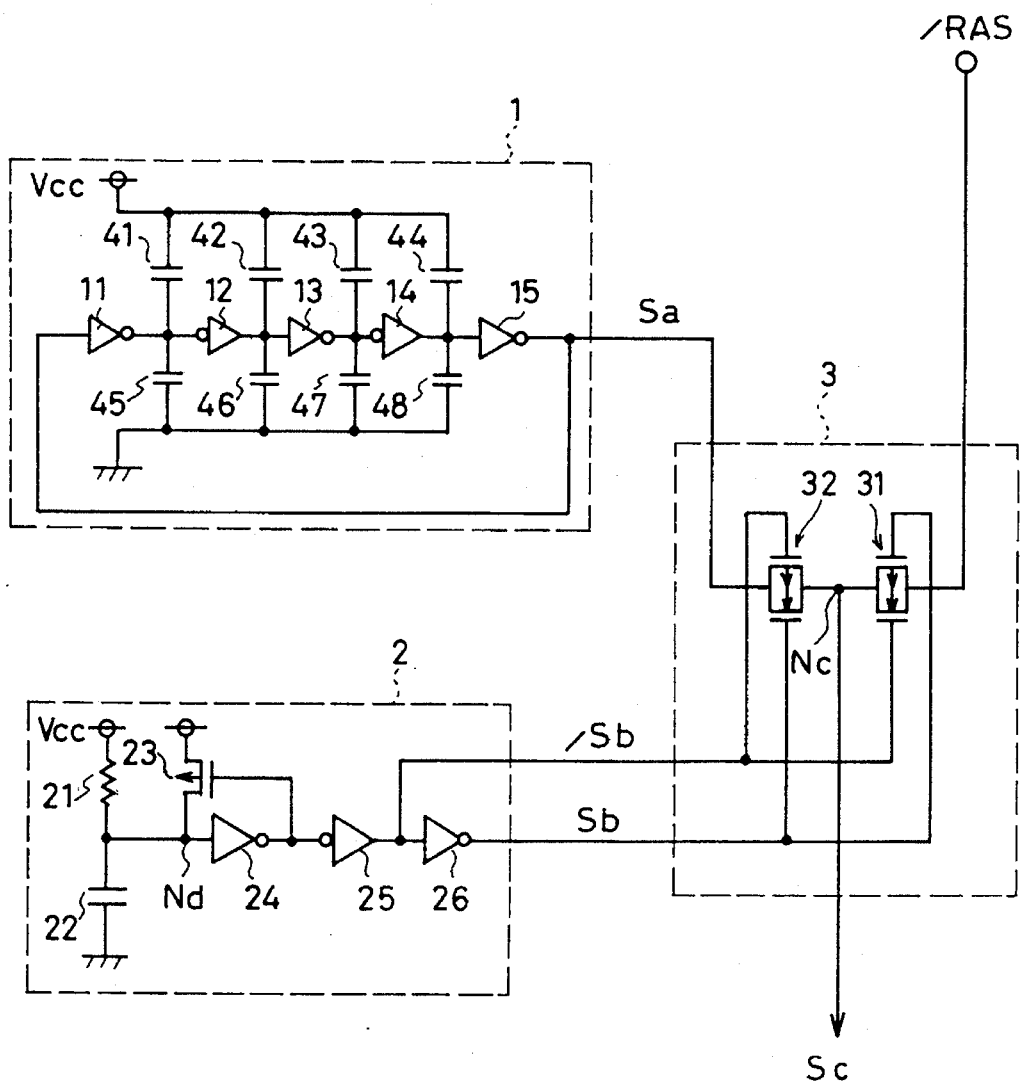
FIG. 2 is a circuit diagram of a dummy clock signal generator, a timer circuit and a switching circuit shown in FIG. 1.

FIG. 2 is a circuit diagram of the dummy clock signal generator 1, timer circuit 2 and switching circuit 3 shown in FIG. 1. Referring to FIG. 2, the dummy clock signal generator 1 includes inverters 11–15 which are cascade-connected in a ring form, and capacitors 41–48 each of which is connected between a common connection node of the two inverters and the supply potential Vcc or ground. The inverters 11–15 and capacitors 41–48 form a ring oscillator. An oscillation frequency of the ring oscillator depends on mutual conductances of transistors (not shown)

forming the respective inverters 11–15 and the capacities of capacitors 41–48. After the start of supply of the supply voltage Vcc, the dummy clock signal generator 1 generates the dummy clock signal Sa having a predetermined frequency and applies the same to the switching circuit 3.

The timer circuit 2 includes a resistor 21 and a capacitor 22 which form an RC integrating circuit, three cascade-connected inverters 24–26, and a PMOS transistor 23 for pulling up an input node of the inverter 24. The resistor 21 and capacitor 22 are connected in series between the supply potential Vcc and ground. After the start of supply of the supply voltage Vcc, an output voltage of the RC integrating circuit rises in accordance with a time constant determined by the resistor 21 and capacitor 22. The inverter 24 has a predetermined threshold voltage, and compares the output voltage supplied from the RC integrating circuit with the threshold voltage.

The switching circuit 3 includes two CMOS transmission gates 31 and 32 connected to an output node Nc. The transmission gate 31 receives the signal /RAS. The transmission gate 32 receives the dummy clock signal Sa. The transmission gates 31 and 32 are selectively turned on in response to switching control signals Sb and /Sb generated from the timer circuit 2.

Figure 3:
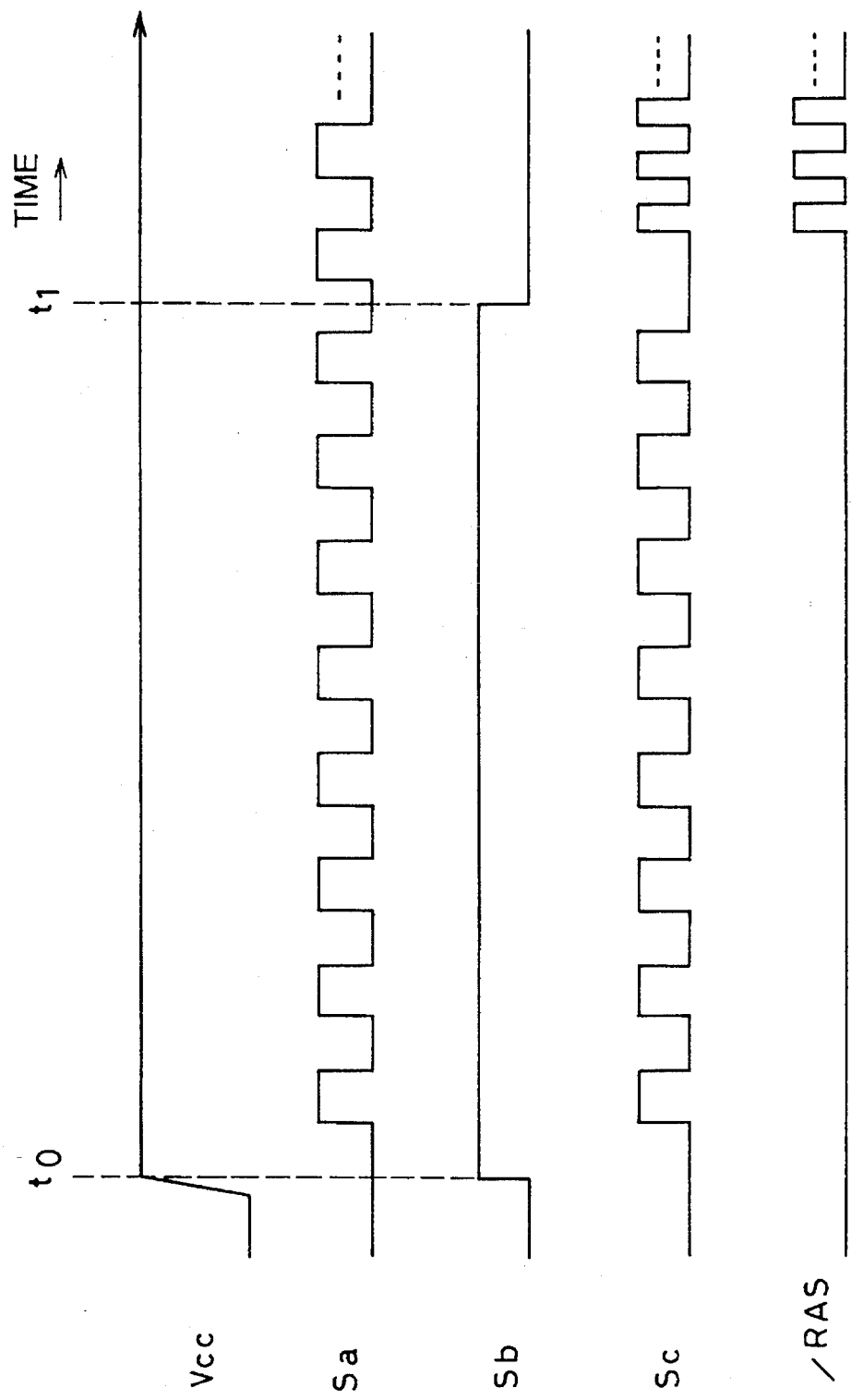
FIG. 3 is a timing chart for explaining an operation of the circuits shown in FIG. 2.

FIG. 3 is a timing chart for explaining operations of the circuits shown in FIG. 2. Referring to FIGS. 2 and 3, the operations will be described below.

At time t0, the supply voltage Vcc starts to be supplied. The dummy clock signal generator 1 receives the supply voltage Vcc, and generates the dummy clock signal Sa at the predetermined frequency. Meanwhile, the timer circuit 2 receives the supply voltage Vcc, and supplies the switching control signals Sb at a high level until time t1. A time length for maintaining the output signal Sb at the high level depends on the resistance of resistor 21, the capacity of capacitor 22 and the threshold voltage of inverter 24.

Until the time t1, the transmission gate 32 is turned on in response to the switching control signal Sb at the high level, and the transmission gate 31 is turned off. Therefore, the dummy clock signal Sa generated from the dummy clock signal generator 1 is applied through the transmission gate 32 to the clock signal generator 51 as the output signal Sc. The clock signal generator 51 responds to the applied signal Sc to initialize or reset an internal function circuit such as the refresh controller 52.

After the time t1, the transmission gate 31 is turned on and the transmission gate 32 is turned off. Therefore, the externally applied signal /RAS is applied through the transmission gate 31 to the clock signal generator 51 as the output signal Sc. After the time t1, therefore, the DRAM 100 shown in FIG. 1 is operated under the control by the externally applied signal /RAS.

In this manner, the DRAM 100 shown in FIG. 1 initializes or resets the internal function circuit such as the refresh counter 53 using the dummy clock signal Sa generated from the dummy clock signal generator 1 after the start of supply of the supply voltage Vcc. Therefore, the DRAM 100 does not require the signal /RAS controlled in a special manner by the external circuit, and thus the load required in the external circuit for controlling the DRAM 100, i.e., for the initialization is reduced.

As described hereinbefore, it is noted that the invention can be utilized for the initialization of the refresh counter in the DRAM as well as for the initialization of the serial counter in the serial access memory, and can be also applied to other various semiconductor memories having internal function circuits to be initialized or reset upon start of supply of the supply voltage.

Although the present, invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:

an internal circuit to be initialized upon start of supply of a supply voltage;

initialization control means for initializing and control said internal circuit in response to an applied clock pulse;

a timer circuit detecting elapse of a redetermined time length after the start of supply of the supply voltage and supplying a switching control signal;

internal clock pulse generating means for receiving the supply voltage and generating the internal clock pulse; and a transfer gate circuit receiving an externally applied state control clock pulse and the internal clock pulse, and responsive to said switching control signal from said timer circuit for selectively applying one of said externally applied state control clock pulse and said internal clock pulse to said initialization control means.

2. A semiconductor memory device according to claim 1, wherein said transfer gate circuit is responsive to said switching control signal from said timer circuit to selectively apply the internal clock pulse to said initialization control means during said predetermined time length after the start of supply of the supply voltage and to selectively apply the externally applied state control clock pulse to said initialization control means after the elapse of said predetermined time length.

3. A semiconductor memory device according to claim 1, wherein said transfer gate circuit includes an output node, first switching means connected to said output node for receiving the externally applied state control clock pulse, and second switching means connected to said output node for receiving the internal clock pulse, said first and second switching means being selectively turned on in response to said time elapse detecting means.

4. A semiconductor memory device according to claim 1, wherein said timer circuit is operated under the supply of the supply voltage, and said transfer gate circuit selectively applies one of said externally applied state control clock pulse and said internal clock pulse to said initialization control means in response to said switching control signal supplied from said timer circuit.

5. A semiconductor memory device according to claim 1, wherein said internal clock pulse generating means includes ring oscillator circuit means for receiving the supply voltage and generating said internal clock pulse.

6. A semiconductor memory device according to claim 1, wherein said internal circuit includes counter circuit means for generating a count signal for controlling said memory device, and said initialization control means includes reset circuit means responsive to an applied clock pulse for resetting said counter circuit means.

7. A semiconductor memory device according to claim 4, wherein said timer circuit includes RC integrating circuit means for receiving the supply voltage and having a time constant which depends on said predetermined time length, and voltage comparing means for comparing an output voltage level of said RC integrating circuit means with a predetermined threshold voltage.

8. A semiconductor memory device according to claim 1, wherein said internal clock pulse generating means includes dummy clock pulse generating means for generating a dummy clock pulse for operating said memory device under a dummy cycle.

9. A semiconductor memory device according to claim 1, wherein said externally applied state control clock pulse is an externally applied row address strobe signal.

10. A semiconductor memory device according to claim 6, further comprising a memory cell array including a plurality of memory cells disposed in rows and columns, wherein said counter circuit means includes a refresh counter which generates a refresh count signal for refreshing a data signal stored in said memory cell array, and said reset circuit means is responsive to an applied clock pulse to reset said refresh counter.

11. A semiconductor memory device according to claim 1, wherein said memory device is a dynamic random access memory.

12. A dynamic random access memory device comprising:

a memory cell array including a plurality of memory cells disposed in rows and columns;

a refresh counter for generating a refresh count signal for refreshing a data signal stored in said memory cell array;

a reset circuit for resetting said refresh counter in response to an applied clock pulse;

a timer circuit supplied with a supply voltage for detecting elapse of a predetermined time length after supply of the supply voltage and supplying a switching control signal;

a ring oscillator supplied with the supply voltage for generating a dummy clock pulse for operating said memory device under a dummy cycle; and a transfer gate circuit receiving the dummy clock pulse and an externally applied row address strobe signal, and response to said switching control signal supplied from said timer circuit for selectively supplying one of said dummy clock pulse and said row address strobe signal to said reset circuit, said transfer gate applying the dummy clock pulse to said reset circuit during said predetermined time length after the start of supply of the supply voltage and applying the row address strobe signal to said reset circuit after the elapse of said predetermined time length.

* * * * *